United States Patent
Derbyshire et al.

[11] Patent Number: 6,147,795
[45] Date of Patent: Nov. 14, 2000

[54] RETROFIT HEATER FOR ERBIUM FIBER IN AN ERBIUM-DOPED FIBER AMPLIFIER (EDFA)

[75] Inventors: William E. Derbyshire, Lehigh Township, Northampton County; Ralph Stephen Jameson, Allentown; Khanh Cong Nguyen, Whitehall Township, Lehigh County, all of Pa.

[73] Assignee: Lucent Technologies Inc., Murray Hill, N.J.

[21] Appl. No.: 09/336,998

[22] Filed: Jun. 21, 1999

[51] Int. Cl.⁷ .............................. H04B 10/04; G02B 6/36
[52] U.S. Cl. ............................ 359/337; 359/177; 372/34
[58] Field of Search .................... 359/161, 177, 359/337, 341; 372/6, 34

[56] References Cited

U.S. PATENT DOCUMENTS

| | | | |
|---|---|---|---|
| 5,541,766 | 7/1996 | Mizrahi et al. | 357/341 |
| 5,859,945 | 1/1999 | Kato et al. | 385/89 |
| 5,943,152 | 8/1999 | Mizrahi et al. | 359/337 |

OTHER PUBLICATIONS

AT&T, Preliminary Data Sheet for 1718–Type EDFA Gain Block, 3 pages, Feb. 1996.
Lee et al, OFC '98, vol. 21 pp. 133–134, 1988 OSA Tech. Digest; Abstract Provided Herewith with atill, Feb. 27, 1998.
Shah et al, 1992 Proc. 42nd Electr. Comp. etech., pp. 842–847; Abstract only herewith, May 20, 1992.
Proc. 1992 IEICE Fall Conf., Part 4, pp. 282, Sep. 30, 1992.

*Primary Examiner*—Nelson Moskowitz

[57] ABSTRACT

A heater system for heating an erbium-doped fiber amplifier (EDFA) of a fiber optic communication system operable in an environment. The heater system includes a pump laser for providing optical power to an erbium fiber in the EDFA. The pump laser is cooled by a thermoelectric cooler (TEC) when a predetermined maximum temperature is reached to maintain the temperature of the laser below the maximum temperature value. The temperature of the laser is sensed by a temperature sensor and is conveyed to a control circuit for generating a control signal. A heater unit is thermally connected to the erbium fiber and is controlled by the control signal in the event that the sensed temperature falls below a predetermined minimum value to maintain the temperature of the fiber above the minimum temperature value. A switch is connected between the control circuit, the TEC and the heater to automatically direct current to either the heater or the TEC depending on the sensed temperature.

13 Claims, 3 Drawing Sheets

RETROFIT HEATER FOR ERBIUM FIBER IN AN ERBIUM-DOPED FIBER AMPLIFIER (EDFA)

BACKGROUND OF THE INVENTION

1. Field of the Invention

The present invention pertains to fiber optic systems utilizing erbium-doped fiber amplifiers (EDFA). More particularly, the invention relates to a heating system for inclusion into an existing EDFA optic system for heating an erbium fiber to maintain optimal EDFA performance.

2. Description of the Related Art

The use of EDFAs in fiber optic communication systems is known. Such EDFAs are used in conjunction with a pump laser which provides optical power at a select frequency for EDFA operation. In existing systems, e.g. systems that are already in place, the pump laser and a thermo-electric cooler (TEC) are produced on a common substrate or chip and the TEC is used to regulate the laser temperature by heating and cooling the pump laser.

One such existing system 10 is depicted in FIG. 1. As there shown, a pump laser 12 is thermally connected to a TEC 14 which, depending on certain conditions, provides heat to and removes heat from the pump laser. The laser temperature is determined using a temperature sensor such as a thermistor 16 connected to a control circuit 18. It is desirable for pump laser 12 to operate below a maximum temperature value and above a minimum temperature value. The control circuit 18 measures the voltage drop across the thermistor 16 and, depending on the measurement, generates a control signal to cause heating or cooling by the TEC. For this purpose, a switching means 20 is connected between a positive voltage supply (V+) and a negative voltage supply (V−). When a temperature below the minimum desired temperature is measured, the control circuit activates the switching means 20 to provide a positive current to the TEC for heating the TEC and, consequently, the laser 12. If, on the other hand, a temperature above the maximum desired temperature is measured from thermistor 16, control circuit 18 causes switching means 20 to provide a negative or oppositely-flowing current to the TEC, thereby causing the TEC to cool the laser.

More specifically, and as understood by those having ordinary skill in the art, the temperature sensor 16 is influenced by heat from the EDFA system environment, by heat produced in normal operation by the pump laser 12, and by heat removed (or added) by the TEC 14. When the temperature of the environment lies above a certain minimum (environment) temperature, the heat from the environment and pump laser 12 causes the temperature of the temperature sensor 16 to rise above a certain minimum (temperature sensor) temperature. The control circuit 18 responds to the temperature of the temperature sensor 16 by activating the switching means 20 to provide an electric current to the TEC 14 to cause heat to be removed from the region in which the temperature sensor 16 and pump laser 12 are disposed. When the temperature of the environment falls below a certain minimum (environment) temperature, the heat from the pump laser 12 is insufficient to maintain the temperature of the temperature sensor 16 above a certain minimum (temperature sensor) temperature. The control circuit 18 responds to the temperature of the temperature sensor 16 by activating the switching means 20 to provide electric current to the TEC 14 to cause heat to be added to the region in which the temperature sensor 16 and pump laser 12 are disposed. Thus it is to be understood that in the prior art, a temperature sensor 16 disposed in thermal contact with pump laser 12 and TEC 14 can be used in conjunction with a control circuit 18 to determine whether the environment temperature lies above a certain maximum or below a certain minimum temperature.

It has been discovered that the gain spectrum of erbium fiber varies with temperature. Further, it is desirable to use a heating system to control the temperature of the erbium fiber, (e.g. to maintain the fiber temperature within a specified range), thereby controlling the variation in the gain spectrum. This can be accomplished by designing a heating system where the erbium fiber and a temperature sensor are both in thermal contact with a heating element. A control circuit, such as control circuit 18 of FIG. 1 can be used to measure the voltage drop across the temperature sensor and, when the measured voltage exceeds a certain value, the control circuit activates a switch which provides electric current to the heating element for heating the erbium fiber to a temperature above a selected minimum temperature.

In the prior art systems developed following the discovery that it is desirable to control the erbium fiber temperature in EDFAs, it is known that a heating system can be incorporated in the EDFA design. In particular, this requires the inclusion in the EDFA system of a heating element, a temperature sensor, a control circuit to monitor the temperature sensor and a switch to provide electric current to the heating element. However, in EDFA systems designed and built prior to the discovery of the desirability of controlling the erbium fiber temperature, no provisions exist for an erbium fiber heating system. Providing control of the erbium fiber temperature for such existing systems would require extensive redesign of control circuitry, including the addition of a temperature sensor and a supply of electric current for a heating element.

Accordingly, it is desirable to provide an easily implemented upgrade to an existing fiber optic EDFA system for regulating fiber temperature without the need for extensive redesign of existing control circuitry.

SUMMARY OF THE INVENTION

A heater system is disclosed for heating an erbium fiber in an erbium-doped fiber amplifier (EDFA) used in a fiber optic communications system to maintain the temperature of the fiber above a minimum temperature value. The heater system is disposed in an environment and contains an integrated pump laser for driving the EDFA, and a thermoelectric cooler (TEC) thermally connected to the pump laser for regulating the temperature of the laser so that the laser temperature is maintained below a maximum temperature value. A thermistor is provided for measuring the temperature of the environment. A control circuit is connected to the thermistor for dynamically producing a control signal in response to the measured temperature. A heater is disposed in thermal contact with the erbium fiber to heat the fiber in response to the control signal. A switching mean electrically connects the heater and TEC to the control circuit for directing current to the heater for heating the fiber when the temperature measured by the thermistor is below the minimum temperature value, and for directing current to the TEC when the temperature measured by the thermistor is above the maximum temperature value.

In a preferred embodiment, the heater and fiber are arranged as a composite element for providing efficient heating to the fiber in the event the measured temperature approaches or falls below a minimum temperature value and the thermistor is disposed in thermal contact with the TEC to provide efficient sensing of the pump laser temperature.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings, wherein like reference characters denote similar elements throughout the several views.

DETAILED DESCRIPTION OF THE CURRENTLY PREFERRED EMBODIMENTS

Figure 1:
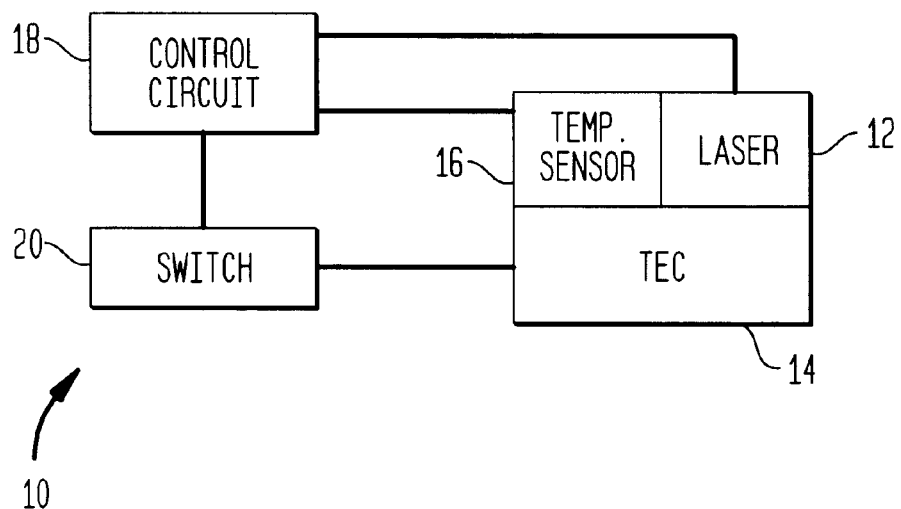
FIG. 1 is a block diagram of a prior art system for heating and cooling a pump laser in a fiber optic communications system.
Figure 2:
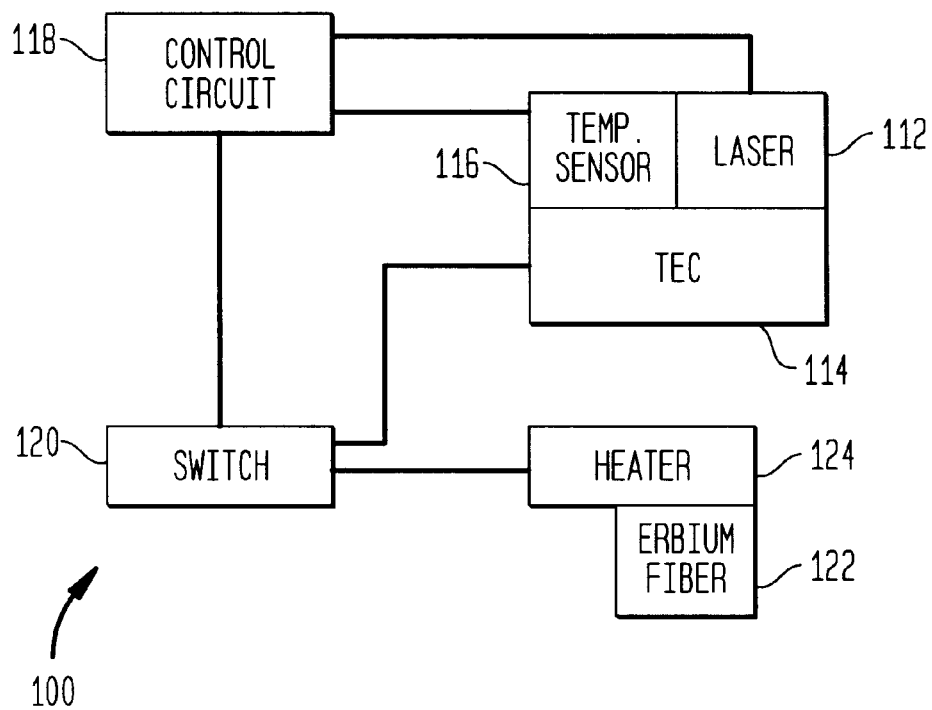
FIG. 2 is a block diagram of a heater system in accordance with the present invention.

FIG. 2 depicts a block representation of an erbium-doped fiber amplifier (EDFA) heater system 100 in accordance with the currently preferred embodiment of the present invention. The EDFA system is contained in an environment, such as an outdoor environment and is, therefore, exposed to the temperature fluctuations and variations in the environment. Like the prior art EDFA system 10 of FIG. 1, system 100 includes a pump laser 112 used for providing operating optical power to an erbium fiber 122 in a manner well-known to those having ordinary skill in the art. The laser 112 is typically formed on a common substrate with a thermal-electric cooler (TEC) 114 that is used for cooling the laser 112 when the laser temperature exceeds a maximum temperature value. The temperature of the laser is sensed by a temperature sensor 116 which is in the form of a thermistor integrally formed on a common substrate with the laser and TEC.

Certain components of the EDFA system 100 and, in particular, the pump laser 112 and the erbium fiber 122, have been shown to operate efficiently over a certain temperature range. Moreover, it has been shown that the gain spectrum of the erbium fiber undesirably varies with temperature and has a reduced gain spectrum at low temperatures, e.g. temperatures below a minimum temperature value of approximately 20° C., whereas the pump laser 112 operates efficiently at low temperatures but not at high temperatures, e.g. not at temperatures above a maximum temperature value of approximately 70° C. Taking into account the temperature sensitivities of the laser 112 and fiber 122, the inventive system has been devised to retro-fit an existing EDFA system of the type shown in FIG. 1 to accommodate the temperature sensitivities of the erbium fiber and thus improve operating efficiency while still providing for cooling of the pump laser in the event an undesirably high temperature is reached.

This is accomplished, as shown in FIG. 2, by utilizing the existing temperature sensor 116, which is preferably integrally formed with the laser, to measure the ambient temperature of the environment in which the system 100 is disposed or contained. The temperature sensor 116, like the sensor 16 of FIG. 1, is preferably a thermistor that dynamically responds to and calculates temperature changes as changes in its resistance value. A control circuit 118, similar to control circuit 18 of FIG. 1, is provided for determining the temperature value from thermistor 116. As is known in the art, the control circuit performs several functions, such as operating the pump laser 112 at appropriate times, as well as tuning the pump laser to accommodate for wavelength shifts, etc. The control circuit 118 also generates a control signal in response to the measured temperature which is used, as explained more fully below, to heat the erbium fiber in the event that the measured temperature is at or below a minimum predetermined temperature value, and to cool the laser 112 in the event that the measured temperature is at or above a maximum predetermined temperature value.

As shown in FIG. 2, a heater unit 124 is disposed in thermal contact with an erbium fiber 122. The heater is preferably a resistive heater that generates heat when current is applied. The generated heat is thermally transferred to the fiber 122 to heat the fiber. The thermoelectric cooler (TEC) 114, as explained above, is provided in thermal contact with the laser 112 and integrally formed therewith; the operation of the TEC is well-known to those having ordinary skill in the art. In prior art systems of the type shown in FIG. 1, the TEC is capable of both heating and cooling the laser 112. In particular, when a positive current is directed to the TEC 114, the TEC functions as a heater for heating the laser, but when a negative current, i.e. a current flowing in a direction opposite the direction of flow of the positive current, flows into the TEC, the TEC functions to cool or remove heat from the laser.

Utilizing the existing components of the prior art heating system of FIG. 1, namely the TEC 14, the laser 12, the temperature sensor 16, the control circuit 18 and the switch 20, it has been discovered that a heater 124 can be incorporated in or retro-fit to the existing system 10, in conjunction with modifications to the switch 20, to provide for both heating of an erbium fiber and cooling of a pump laser. In particular, a switching means 120 directs current generated by the control circuit 118 to either the TEC 114 or the heater 124 depending on the measured temperature determined by temperature sensor 116. Such a configuration is possible because, as explained above, the pump laser 112 will operate efficiently at low temperatures but not at high temperatures. Thus, positive current generated by control circuit 18 can be diverted by the switch 120 from the TEC to the heater 124 and used for heating the fiber. In operation, and in the event that the environment temperature approaches or falls below a minimum temperature value ($T_{min}$), the control circuit 118 will sense the temperature from sensor 116 and generate a control signal which is electrically conveyed to the switch means 120. This causes the switch means to provide current to the heater 124 to heat the fiber 122 to a temperature above $T_{min}$. If, on the other hand, the temperature value approaches or exceeds a maximum temperature value ($T_{max}$), the control signal produced by control circuit 118 causes switch means 120 to direct current to the TEC 114 for cooling the laser 112.

Figure 2A:
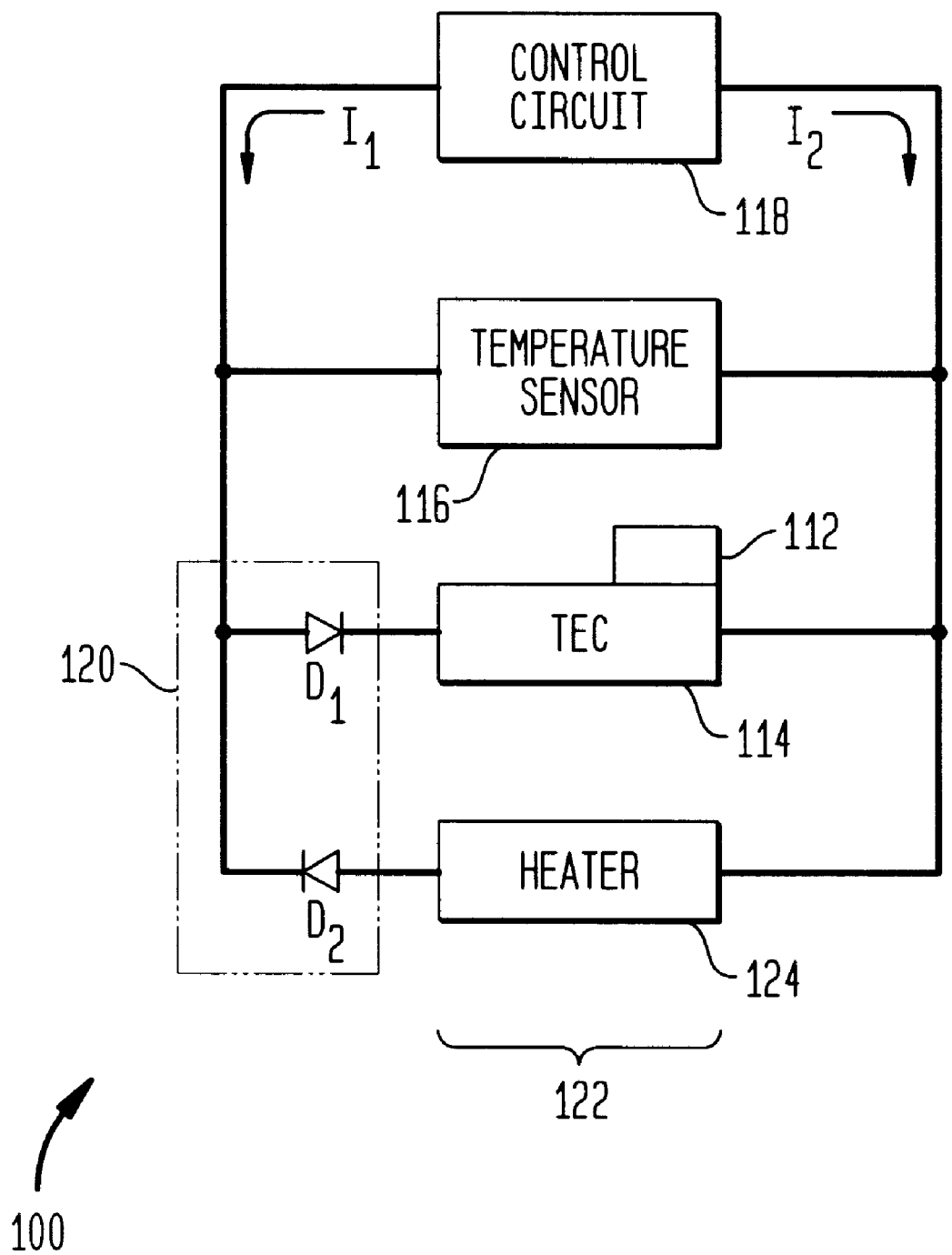
FIG. 2A is a block and partial schematic diagram of the heater system of FIG. 2.

With reference now to FIG. 2A, a schematic block representation of a currently preferred arrangement of the heater system 100 is there shown. In this embodiment, the heater 124 is connected in parallel across the TEC 114 and the switching means is implemented by a pair of diodes $D_1$, $D_2$. When a high temperature is measured from temperature sensor 116, e.g. a temperature near or above $T_{max}$, control circuit 118 will generate a control signal current $I_1$. Diodes $D_1$ and $D_2$ are arranged, as shown, such that current $I_1$ is permitted to flow through $D_1$ and cause TEC 114 to cool laser 112, while diode $D_2$ prevents current $I_1$ from entering heater 124. When, however, a low temperature is measured, current $I_2$ is produced by control circuit 118 and is permitted, by diode $D_2$, to flow through heater 24 and heat fiber 122 while diode $D_1$ prevents current $I_2$ from flowing through TEC 114.

Although diodes are shown in FIG. 2A to implement the switching means 120, the function of the switching means can be produced in numerous ways, as will be apparent to those having ordinary skill in the art, such for example as by employing field-effect transistors (FETs) and/or bipolar-junction transistors (BJTs). This and other such modifications are within the intended scope and contemplation of the invention.

Figure 3:
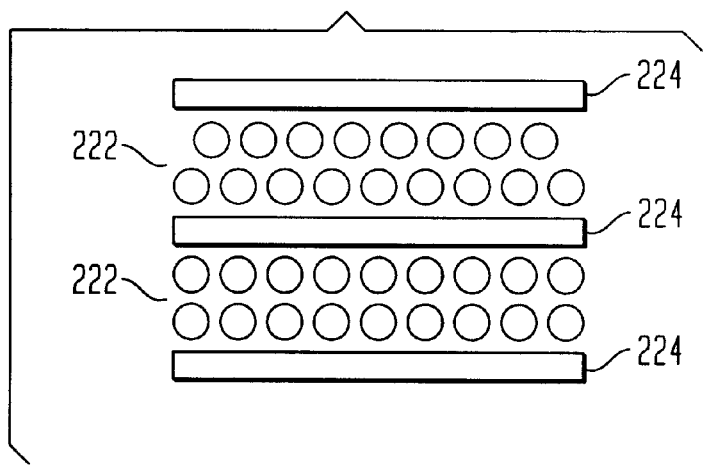
FIG. 3 is a cross-sectional view of an arrangement of heater elements and erbium fibers in accordance with a preferred embodiment of the present invention.
Figure 4:
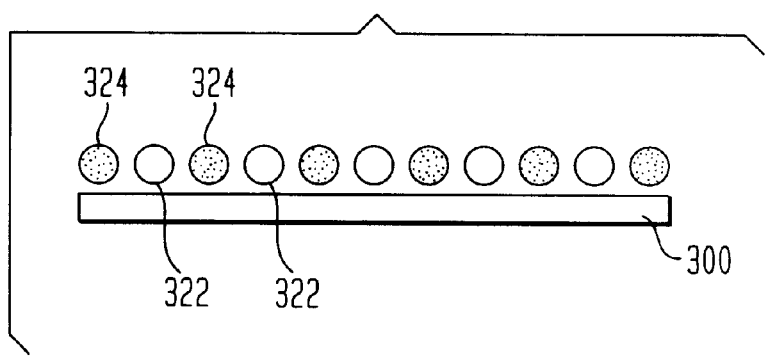
FIG. 4 is a cross-sectional view of an arrangement of heater elements and erbium fibers in accordance with another embodiment of the present invention.
Figure 5:
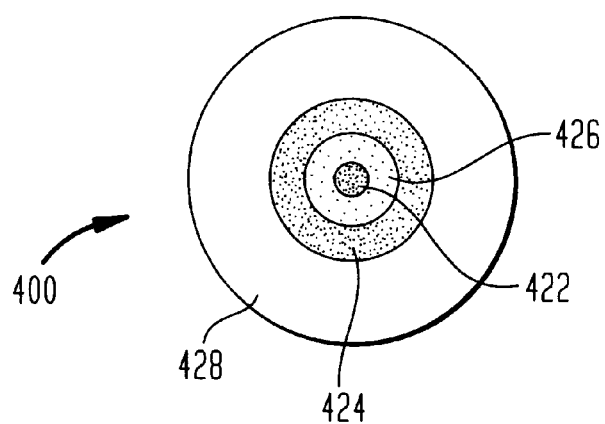
FIG. 5 is a cross-sectional view of a composite erbium fiber and heater element in accordance with yet another preferred embodiment of the present invention.

FIGS. 3–5, depict various thermally-coupled arrangements of an erbium fiber with a heater. FIG. 3 shows a cross-section of an erbium fiber having a plurality of fiber elements 222. The fiber elements are arranged in a stacked configuration and are sandwiched between heater elements 224 configured as substantially flat plates. FIG. 4 depicts another fiber-heater arrangement wherein individual heater elements 324 are positioned in an interleaved or juxtaposed arrangement with individual fiber elements 322. The resulting combination is mounted to substrate 300 which is preferably constructed of an electrically non-conductive material. FIG. 5 shows a cross-section of yet another heater-fiber arrangement; in this figure, a hybrid or composite heater and fiber 400 is formed. In particular, an erbium fiber element 422 is surrounded or encased by a thermally conductive cladding material 426. A heating element 424 is disposed about the cladding for providing heat to the fiber element 422. The hybrid element 400 is then encased with a protective coating 428, preferably formed of a polymer material.

Thus, while there have shown and described and pointed out fundamental novel features of the invention as applied to preferred embodiments thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

We claim:

1. A method of upgrading an existing erbium-doped fiber amplifier (EDFA) system including an erbium fiber contained in an environment to maintain the erbium fiber at a temperature above a predetermined minimum temperature value, the EDFA system having a pump laser efficiently operable below a predetermined maximum temperature value for driving the erbium fiber, a temperature sensor for sensing the temperature of the pump/laser, a control circuit electrically connected to the temperature sensor for generating operating current in response to a value of the sensed temperature, and a thermo-electric cooler (TEC) thermally connected to the pump laser for cooling the pump laser when the sensed temperature exceeds the maximum temperature value, the method comprising the steps of:

connecting a heater across the TEC and positioning said heater in thermal contact with the erbium fiber for heating the fiber when the sensed temperature falls below the minimum temperature value; and providing the operating current to said heater when the sensed temperature is below the minimum temperature value for heating the fiber, and providing the operating current to the TEC when the sensed temperature exceeds the maximum temperature value for cooling the laser.

2. The method of claim 1, wherein said temperature sensor comprises a thermistor.

3. The method of claim 1, wherein said pump laser, said TEC and said temperature sensor are formed on a common substrate.

4. The method of claim 1, wherein said providing step is performed by a switching means comprising a pair of diodes.

5. The method of claim 1, wherein said erbium fiber comprises a plurality of individual fibers defining a periphery, and wherein said heater is disposed beyond said periphery.

6. The method of claim 1, wherein said erbium fiber comprises a plurality of substantially parallel fibers and wherein said heater comprises a plurality of heating coils, said heating coils and said fibers being arranged in a substantially interleaved manner.

7. The method of claim 1, wherein said erbium fiber comprises a plurality of fibers and wherein said heater and said fibers are configured as a plurality of fiber elements with each fiber element comprising an erbium core surrounded by a heater material.

8. The method of claim 7, wherein said heater material is surrounded by a protective coating.

9. The method of claim 2, wherein said switching means is operable to permit forward current to enter said heater for heating said erbium fiber and to permit reverse current to enter said TEC for cooling said pump laser.

10. The method of claim 1, wherein said erbium fiber comprises a plurality of individual fibers bonded in contact with said heater using an adhesive material.

11. The method of claim 1, wherein said heater comprises a substantially planar heating element.

12. The method of claim 7, wherein the said heater material is contained within a glass material encompassing said erbium core and comprising said erbium fiber.

13. The method of claim 12, wherein the said heater element is composed of an electrically conductive material.

* * * * *